United States Patent
Kim et al.

(10) Patent No.: US 7,064,059 B2
(45) Date of Patent: Jun. 20, 2006

(54) METHOD OF FORMING DUAL DAMASCENE METAL INTERCONNECTION EMPLOYING SACRIFICIAL METAL OXIDE LAYER

(75) Inventors: Jae-Hak Kim, Seoul (KR);
Young-Joon Moon, Seoul (KR);
Kyoung-Woo Lee, Seoul (KR);
Jeong-Wook Hwang, Seoul (KR)

(73) Assignee: Samsung Electronics, Co., Ltd (KR)

( * ) Notice: Subject to any disclaimer, the term of this patent is extended or adjusted under 35 U.S.C. 154(b) by 0 days.

(21) Appl. No.: 10/939,930

(22) Filed: Sep. 13, 2004

(65) Prior Publication Data

US 2005/0124149 A1    Jun. 9, 2005

(30) Foreign Application Priority Data

Dec. 3, 2003    (KR) .................. 10-2003-0087351

(51) Int. Cl.
*H01L 21/4763*  (2006.01)
*H01L 21/311*   (2006.01)
*H01L 21/302*   (2006.01)
*H01L 21/461*   (2006.01)

(52) U.S. Cl. .................. 438/637; 438/618; 438/694; 438/738

(58) Field of Classification Search ........... 438/637, 438/618, 694, 738, 706, 422, 424, 624
See application file for complete search history.

(56) References Cited

U.S. PATENT DOCUMENTS

| 6,100,200 A  * | 8/2000  | Van Buskirk et al. ...... 438/697 |
| 6,329,118 B1   | 12/2001 | Hussein et al. .......... 430/270.1 |
| 6,461,955 B1   | 10/2002 | Tsu et al. .................. 438/618 |
| 6,898,851 B1 * | 5/2005  | Nishioka et al. .............. 29/852 |

FOREIGN PATENT DOCUMENTS

JP    01-230317    8/2001
KR    02-88399     11/2002

* cited by examiner

*Primary Examiner*—Chuong Anh Luu
(74) *Attorney, Agent, or Firm*—Mills & Onello LLP

(57) ABSTRACT

There is provided a method of forming a dual damascene metal interconnection by employing a sacrificial metal oxide layer. The method includes preparing a semiconductor substrate. An interlayer insulating layer is formed on the semiconductor substrate, and a preliminary via hole is formed by patterning the interlayer insulating layer. A sacrificial via protecting layer is formed on the semiconductor substrate having the preliminary via hole to fill the preliminary via hole, and cover an upper surface of the interlayer insulating layer. A sacrificial metal oxide layer is formed on the sacrificial via protecting layer, the sacrificial metal oxide layer is patterned to form a sacrificial metal oxide pattern having an opening crossing over the preliminary via hole, and exposing the sacrificial via protecting layer. The sacrificial via protecting layer and the interlayer insulating layer are etched using the sacrificial metal oxide pattern as an etch mask to form a trench located inside the interlayer insulating layer.

20 Claims, 6 Drawing Sheets

METHOD OF FORMING DUAL DAMASCENE METAL INTERCONNECTION EMPLOYING SACRIFICIAL METAL OXIDE LAYER

CROSS-REFERENCE TO RELATED APPLICATION

This application claims the benefit of Korean Patent Application No. 2003-87351, filed on Dec. 3, 2003, the contents of which are hereby incorporated herein by reference in their entirety.

BACKGROUND

1. Technical Field

The present invention relates to a method of forming semiconductor devices, and more particularly, to a method of forming a dual damascene metal interconnection employing a sacrificial metal oxide layer.

2. Discussion of the Related Art

With the increase of integration degrees of semiconductor devices, the process of metal interconnection fabrication is becoming increasingly important in affecting reliability of semiconductor devices. Metal interconnections are associated with problems such as RC delay, EM (electro-migration), or the like. As one of the methods of solving the problems, a copper interconnection and a low-k dielectric layer are employed on a semiconductor device, and a damascene process is used to form a copper interconnection.

A dual damascene process comprises forming a via hole exposing a lower interconnection, and a trench intersecting the upper portion of the via hole, filling the via hole and the trench with a metal material such as copper, and forming a metal interconnection and a via plug at the same time, through a chemical mechanical polishing (CMP) process. The dual damascene metal interconnection means a metal interconnection formed by the dual damascene process.

Further, a dual damascene process of first forming a via hole, and then forming a trench may be referred to as a via first dual damascene (VFDD) process. However, the VFDD process may provide a lack of process margins of a photolithography process, in comparison with a typical photolithography process of forming a via hole or a trench only. Particularly, as a problem, there may be considered a process margin of a photolithography process of forming the trench after forming the via hole. Further, etch damage may be caused in the lower interconnection exposed through the via hole during the formation of the trench.

A method of preventing etch damage of the lower interconnection and increasing a process margin of a photolithography process is described in U.S. Pat. No. 6,329,118, entitled, "Method for patterning dual damascene interconnects using a sacrificial light absorbing material," to Hussein et. al.

In the method disclosed in U.S. Pat. No. 6,329,118, a via hole, formed inside an insulating layer, is filled with a sacrificial light absorbing material, and a photoresist pattern is formed on the sacrificial light absorbing material to form a trench. Then, using the photoresist pattern as an etch mask, the sacrificial light absorbing material and the insulating layer are etched to form the trench.

The sacrificial light absorbing material reduces substrate reflectivity during an exposure step in a photolithography process, and improves a capability of controlling a critical dimension (CD) and a CD uniformity. Further, the sacrificial light absorbing material may be dry etched at substantially the same rate that the insulating layer may be dry etched, and wet etched at a significantly faster rate than the insulating layer may be wet etched. Therefore, lower interconnects exposed through the via hole can be protected during the formation of the trench.

However, as the integration of semiconductor devices further increases, a pitch of the trench is further reduced. In the case that a design rule is 90 nm or less, it is difficult to form a photoresist pattern having an appropriate pitch just with an exposure step using a KrF laser. Furthermore, in order to etch an insulating layer using the photoresist pattern as an etch mask, a photoresist layer is required to have a thickness above a predetermined level. Thus, a photolithography process using a KrF laser as above is led to a lack of process margins such as a resolution and a depth of focus (DOF). To comply with this, there is employed a photolithography process using an ArF laser. The photolithography process using an ArF laser is advantageous in improving resolution, and allowing the formation of a much finer photoresist pattern in comparison with the conventional photolithography process using a KrF laser. However, the photoresist layer for ArF has a lower etch resistance than the photoresist layer for KrF. As a result, an etch process of forming a trench using the photoresist pattern as an etch mask cannot provide desired process margins.

Therefore, the dual damascene process of forming a trench using the photoresist pattern as an etch mask by the method disclosed in U.S. Pat. No. 6,329,118 cannot ensure process margins of photolithography and etch processes at the same time, in the recent trends of highly-integrated semiconductor devices.

SUMMARY OF THE INVENTION

Therefore, the present invention provides a method of forming a dual damascene metal interconnection, the method being improving process margins of a photolithography process and an etch process together for the formation of a trench, without requiring an additional process for aligning a via hole and a trench.

Exemplary embodiments of the present invention provide a method of forming a dual damascene metal interconnection employing a sacrificial metal oxide layer.

The invention is directed to a method of forming a dual damascene metal interconnection. The method includes preparing a semiconductor substrate. An interlayer insulating layer is formed on the semiconductor substrate, and the interlayer insulating layer is patterned to form a preliminary via hole. A sacrificial via protecting layer is formed on the semiconductor substrate having the preliminary via hole to fill the preliminary via hole, and to cover an upper surface of the interlayer insulating layer. A sacrificial metal oxide layer is formed on the sacrificial via protecting layer, and the sacrificial metal oxide layer is patterned to form a sacrificial metal oxide pattern having an opening crossing over the preliminary via hole, and exposing the sacrificial via protecting layer. The sacrificial via protecting layer and the interlayer insulating layer are etched using the sacrificial metal oxide pattern as an etch mask to form a trench located inside the interlayer insulating layer.

In accordance with the invention, a photolithography process margin may be ensured since an ArF laser may be used in a photolithography process of forming the sacrificial metal oxide pattern, and a process margin of an etch process may be ensured since a trench may be formed using the sacrificial metal oxide pattern as an etch mask.

In accordance with an exemplary embodiment, the sacrificial metal oxide pattern and the sacrificial via protecting layer are removed to expose an upper surface of the interlayer insulating layer and a bottom surface of the preliminary via hole. Then, the exposed bottom surface of the preliminary via hole is etched to form a final via hole exposing the semiconductor substrate. A diffusion barrier layer and a seed layer are sequentially formed on the semiconductor substrate having the final via hole, and a copper layer is formed on the semiconductor substrate having the seed layer to fill the empty space of the final via hole and the trench. Then, until an upper surface of the interlayer insulating layer is exposed, the copper layer, the seed layer, and the diffusion barrier layer are sequentially planarized to form a dual damascene metal interconnection.

In one embodiment, a capping layer may be further formed on the sacrificial metal oxide layer. The capping layer functions to reduce a reflectivity of the sacrificial metal oxide layer, and improve a capability of controlling a CD and a CD uniformity. The capping layer is preferably formed to have a thickness of 100 Å to 500 Å. Further, while patterning the sacrificial metal oxide layer, the capping layer may be patterned together to form a capping layer pattern. The capping layer pattern is preferably removed during the formation of the trench.

Preferably, before forming the interlayer insulating layer, an etch barrier layer may be formed. The etch barrier layer may include a silicon nitride (SiN) layer, a silicon carbide (SiC) layer, or a silicon carbon nitride (SiCN) layer. The etch barrier layer functions to prevent etch damages on the semiconductor substrate during the formation of the preliminary via hole.

Further, the interlayer insulating layer is preferably formed of a low-k dielectric layer having an etch selectivity to the etch barrier layer. The interlayer insulating layer may be formed of a silicon oxycarbide layer (SiOC) or a silicon oxide layer ($SiO_2$), such as a FSG (fluorine doped silicate glass) layer, a PSG (phosphorous silicate glass) layer, a USG (undoped silicate glass) layer, a BPSG (boro phosphorous silicate glass) layer, and a PE-TEOS (plasma enhanced-tetra ethyl ortho silicate) layer, or may be formed by stacking the above layers. Further, the interlayer insulating layer may be formed of an organo polymer having a low dielectric constant.

Further, the sacrificial via protecting layer may be preferably formed of a spin on deposition (SOD) layer which is dry etched at a dry etch rate which is substantially identical to that of the interlayer insulating layer, and has a significantly high wet etch selectivity to the interlayer insulating layer. The SOD layer can fill the preliminary via hole even with a small deposition thickness, and has a good planarization characteristics thereby increasing a process margin of a photolithography process. Preferably, the SOD layer may be formed of a hydrogen-siloxane layer, an organo-siloxane layer, or an SOP (spin on polymer) layer, and more preferably, may be formed of HSQ (hydrogen silsequioxane) or MSQ (methyl silsequioxane).

In one embodiment, the sacrificial metal oxide layer is transparent in a visible wavelength region. The sacrificial metal oxide layer may be formed of an aluminum oxide ($Al_2O_3$) layer, an indium tin oxide (InSnO) layer, a tantalum oxide ($Ta_2O_5$) layer, a lanthanum oxide ($La_2O_3$) layer or a hafnium oxide ($HfO_2$) layer, or may be formed by stacking at least two layers of the above. More preferably, the sacrificial metal oxide layer is formed of an $Al_2O_3$ layer.

Further, the sacrificial metal oxide layer may be formed with a thickness of 200 Å to 1,000 Å. As the thickness of the sacrificial metal oxide layer decreases, a process margin of a photolithography process for patterning the sacrificial metal oxide layer may increase.

In one embodiment, the method further comprises forming a photoresist layer on the sacrificial metal oxide layer and exposing and developing the photoresist layer using an ArF laser to form a photoresist pattern having an opening crossing over the preliminary via hole. The sacrificial metal oxide layer can be patterned by etching the sacrificial metal oxide layer using the photoresist pattern as an etch mask.

In one embodiment, the method further comprises forming an organic bottom anti-reflective coating (BARC) on the sacrificial metal oxide layer after forming the sacrificial metal oxide layer. The organic BARC can be removed prior to formation of the trench. The organic BARC can be removed using an ashing process.

In one embodiment, the method further comprises forming a capping layer on the sacrificial metal oxide layer prior to formation of the organic BARC. The capping layer can be formed of one material layer selected from the group consisting of poly-Si, FSG, PSG, USG, PE-TEOS, SiOC, SiN, SiON, SiC, and SiCN layer. The removal of the sacrificial metal oxide pattern and the sacrificial via protecting layer is preferably performed by wet etching the sacrificial metal oxide pattern and the sacrificial via protecting layer together using HF solution as an etchant. Specifically, if the sacrificial via protecting layer is formed of a hydrogen-siloxane layer such as HSQ, the sacrificial metal oxide pattern and the sacrificial via protecting layer can be removed by wet etching them together using HF solution as an etchant. Therefore, a process of removing the sacrificial metal oxide pattern and the sacrificial via protecting layer can be simplified. However, if the sacrificial via protecting layer is formed of an organo-siloxane layer, such as MSQ, or an organic polymer, the sacrificial via protecting layer may not be removed just using HF solution as an etchant. In this case, the sacrificial metal oxide pattern may be removed using HF solution as an etchant, and then, the sacrificial via protecting layer may be removed using an organo stripper.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
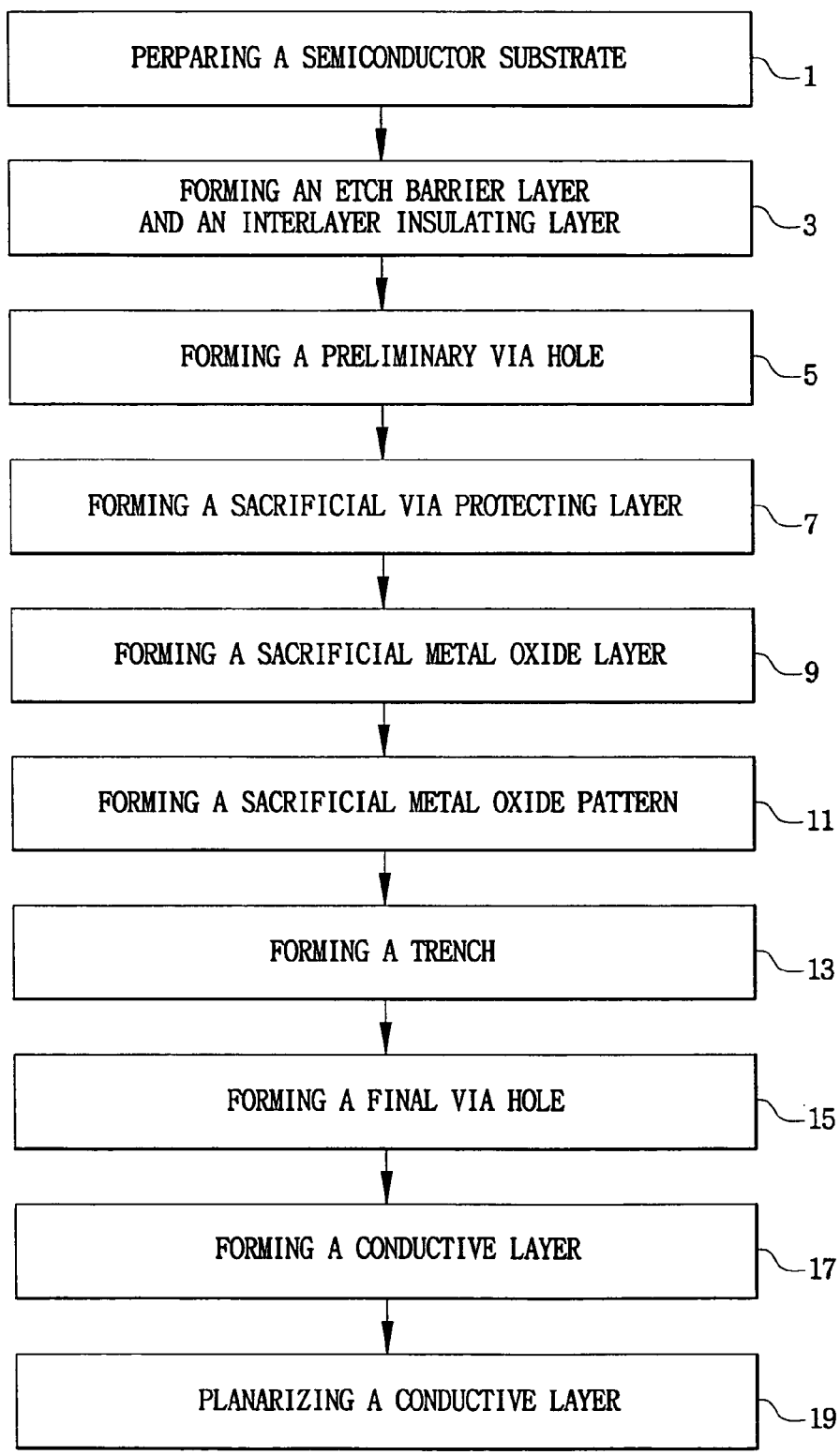
FIG. 1 is a sequential flow chart illustrating a method of forming a dual damascene metal interconnection according to one embodiment of the present invention.

The present invention will now be described more fully hereinafter with reference to the accompanying drawings, in which preferred embodiments of the invention are shown. In the drawings, the thickness of layers and regions are exaggerated for clarity.

FIG. 1 is a sequential flow chart illustrating a method of forming a dual damascene metal interconnection according to an embodiment of the present invention, and FIGS. 2 to 11 are sectional views illustrating a method of forming a dual damascene metal interconnection according to the sequential flow chart of FIG. 1.

Figure 2:
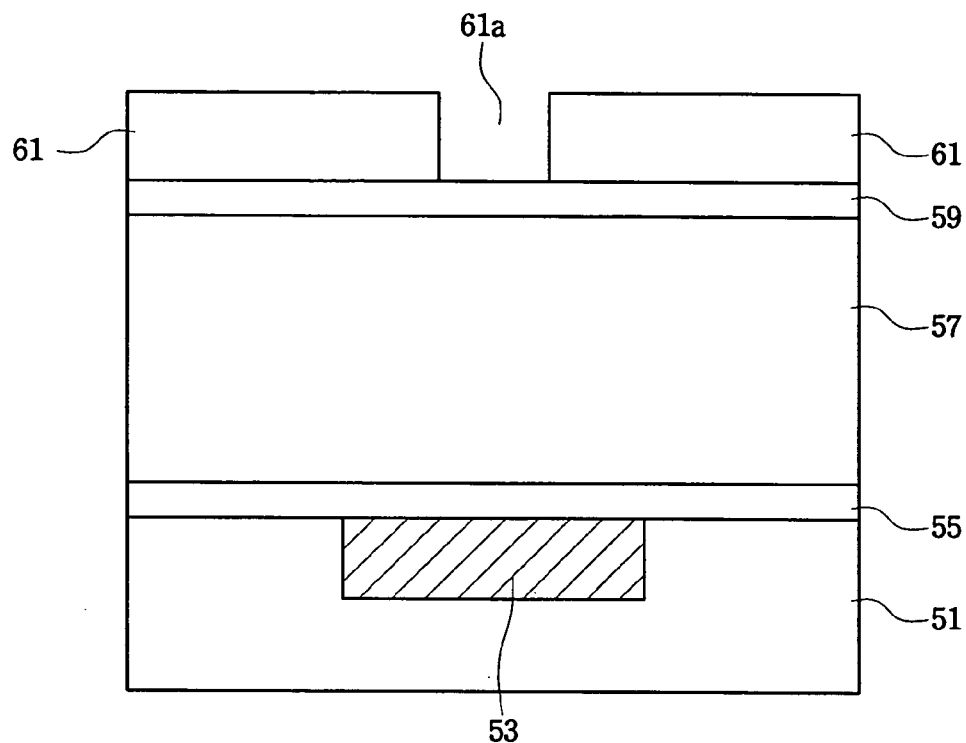
FIGS. 2 to 11 are sectional views illustrating a method of forming a dual damascene metal interconnection according to one embodiment of the present invention.

Referring to FIGS. 1 and 2, there is prepared a semiconductor substrate 51 having a lower interconnection 53 (step 1 of FIG. 1). The lower interconnection 53 may be formed using a damascene process. Further, the lower interconnection 53 may be a copper interconnection, and a diffusion barrier layer (not shown) may be formed on the side walls and the bottom of the copper interconnection 53.

Further, the semiconductor substrate 51 may have discrete devices such as a transistor (not shown) or a capacitor (not shown).

An interlayer insulating layer 57 is formed on the semiconductor substrate 51 (step 3 of FIG. 1). Before forming the interlayer insulating layer 57, an etch barrier layer 55 may be first formed. In the case that the lower interconnection 53 is a copper interconnection, the etch barrier layer 55 may function as a barrier to suppress out-diffusion of copper atoms into other layers. Furthermore, the etch barrier layer 55 functions to protect the lower interconnection 53 from etch damages, which may occur in subsequent processes. Thus, the etch barrier layer 55 is preferably formed to include a material layer such as SiN, SiC, or SiCN. Typically, since the etch barrier layer 55 may have a high dielectric constant, preferably, the etch barrier layer 55 is formed to have a thickness as thin as possible, but is sufficiently thick to serve as a barrier layer. The etch barrier layer 55 may be formed with a thickness of 500 Å to 1,000 Å, and more preferably, it is formed with a thickness of 600 Å to 800 Å.

The interlayer insulating layer 57 functions to isolate the interconnections from one another. The interlayer insulating layer 57 may be formed of a low-k dielectric layer to reduce a RC delay to comply with a recent demand for more and more highly-integrated semiconductor devices. Further, the interlayer insulating layer 57 may have an etch selectivity with respect to the etch barrier layer 55.

The interlayer insulating layer 57 may be formed of an SiOC layer or an $SiO_2$ layer, such as FSG, PSG, USG, BPSG, PE-TEOS layer, and it may be formed by stacking at least two of the above layers. Further, the interlayer insulating layer 57 may be formed of organic polymer having a low dielectric constant, such as SiLK.

A first photoresist layer is formed on the interlayer insulating layer 57. Then, the first photoresist layer is exposed and developed to form a first photoresist pattern 61 having an opening 61a over the lower interconnection 53. Before forming the first photoresist layer, a bottom antireflective coating (BARC) 59 may be formed. The BARC 59 is preferably formed of an organic material. Thus, the BARC 59 is exposed through the opening 61a over the lower interconnection 53.

Figure 3:
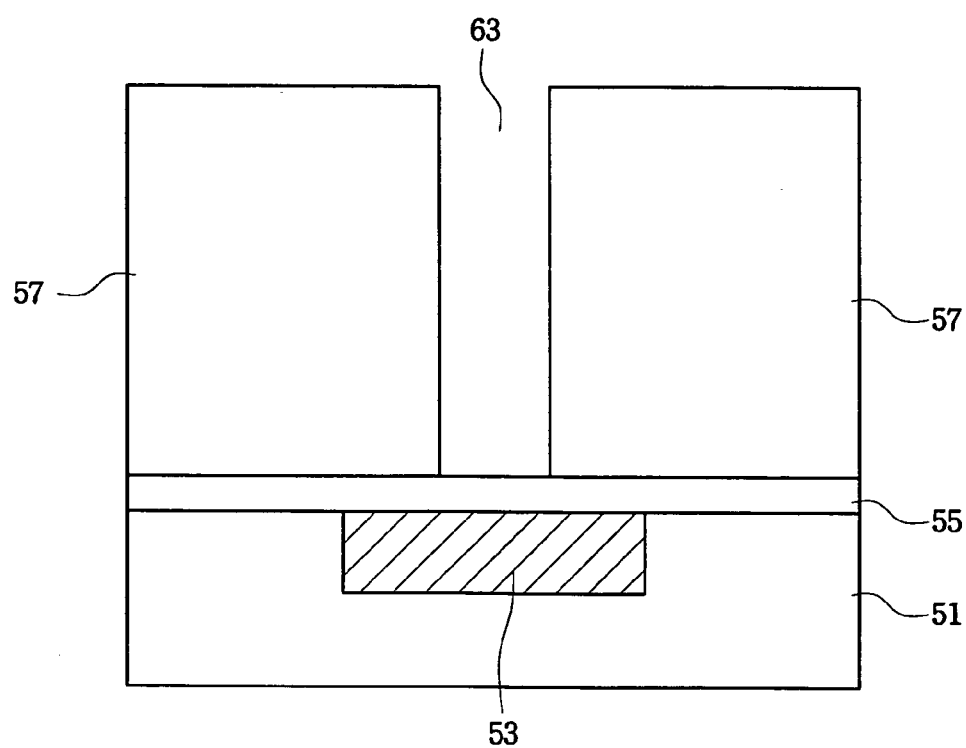

Referring to FIGS. 1 and 3, the BARC 59 and the interlayer insulating layer 57 are sequentially etched using the first photoresist pattern 61 as an etch mask to form a preliminary via hole 63 (step 5 of FIG. 1). Through the preliminary via hole 63, the etch barrier layer 55 may be exposed.

The interlayer insulating layer 57 may be formed of a material layer having an etch selectivity with respect to the etch barrier layer 55. Thus, the etch barrier layer 55 may remain on the lower interconnection 53. As such, etch damage of the lower interconnection 53 is prevented during the formation of the preliminary via hole 63.

In the case in which the interlayer insulating layer 57 is formed of an $SiO_2$ layer or an SiOC layer, after forming the preliminary via hole 63, the first photoresist pattern 61 and the BARC 59 are removed using, for example, an ashing process. In the case in which the BARC 59 is formed of organic material, the first photoresist pattern 61 and the BARC 59 may be removed at the same time using an ashing process.

Further, in the case in which the interlayer insulating layer 57 is formed of an organic polymer such as SiLK, the preliminary via hole 63 may be formed using an ashing process. Thus, the first photoresist pattern 61 and the BARC 59 may be removed during the formation of the preliminary via hole 63.

Figure 4:
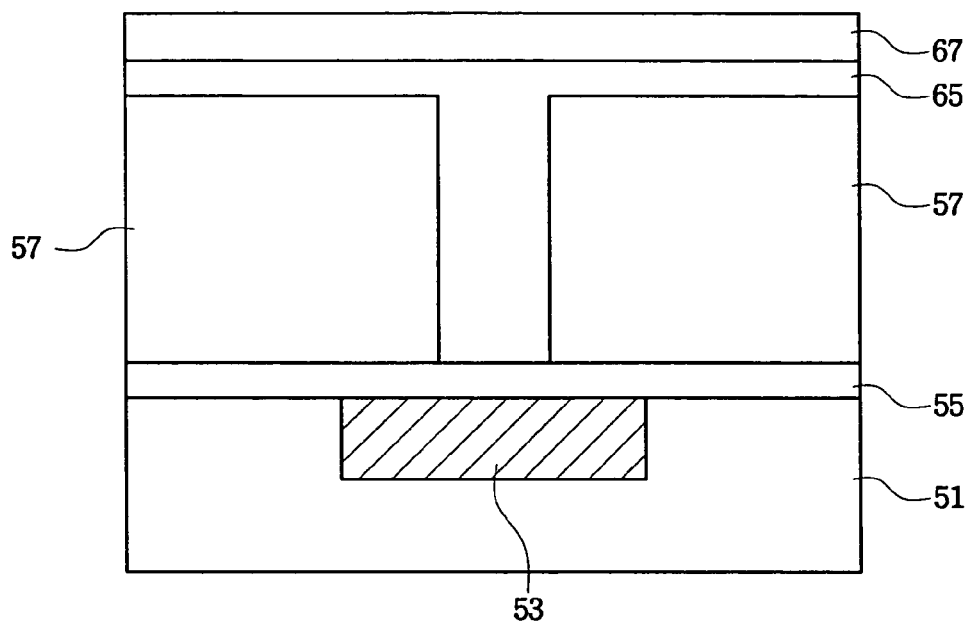

Referring to FIGS. 1 and 4, a sacrificial via protecting layer 65 is formed on the semiconductor substrate having the preliminary via hole 63 (step 7 of FIG. 1). The sacrificial via protecting layer 65 fills the preliminary via hole 63, and covers the upper surface of the interlayer insulating layer 57.

The sacrificial via protecting layer 65 may be formed of a spin on deposition (SOD) layer which is dry etched at a dry etch rate which is substantially identical to that of the interlayer insulating layer 57, and has a significantly high wet etch selectivity with respect to the interlayer insulating layer 57. The SOD layer is a layer which is deposited using a spin coating. The SOD layer may be a hydrogen-siloxane layer such as HSQ, an organo-siloxane layer such as MSQ, or a spin on polymer (SOP) layer. Since the SOD layer exhibits good via hole filling characteristics and good planarization characteristics, it can be normally used as filling material or planarization material.

Further, the SOD layer is preferably formed of a transparent layer in a wavelength region for alignment, that is, a visible wavelength region, for a subsequent alignment process.

The sacrificial via protecting layer 65 may be formed with a thickness of 500 Å to 3,000 Å.

A sacrificial metal oxide layer 67 is formed on the sacrificial via protecting layer 65 (step 9 of FIG. 1). As the sacrificial via protecting layer 65 covers the upper surface of the interlayer insulating layer 57, the sacrificial metal oxide layer 67 may be formed flat.

The sacrificial metal oxide layer 67 may be formed of $Al_2O_3$, $InSnO$, $Ta_2O_5$, $La_2O_3$, or $HfO_2$ layer, or alternatively, it may be formed by stacking at least two layers of the above. Further, the sacrificial metal oxide layer 67 may be formed with a thickness of 200 Å to 1,000 Å. As the thickness of the sacrificial metal oxide layer 67 decreases, the process margin of a photolithography process increases. But, the sacrificial metal oxide layer 67 should keep an appropriate thickness, since it is used as an etch mask in a subsequent process.

The sacrificial metal oxide layer 67 may be formed using a physical vapor deposition (PVD) technology. That is, the sacrificial metal oxide layer 67 may be formed by sputtering a metal target in the presence of plasma containing oxygen atoms.

Alternatively, the sacrificial metal oxide layer 67 may be formed using a typical atomic layer deposition (ALD) technology, or a chemical vapor deposition (CVD) technology.

Figure 5:
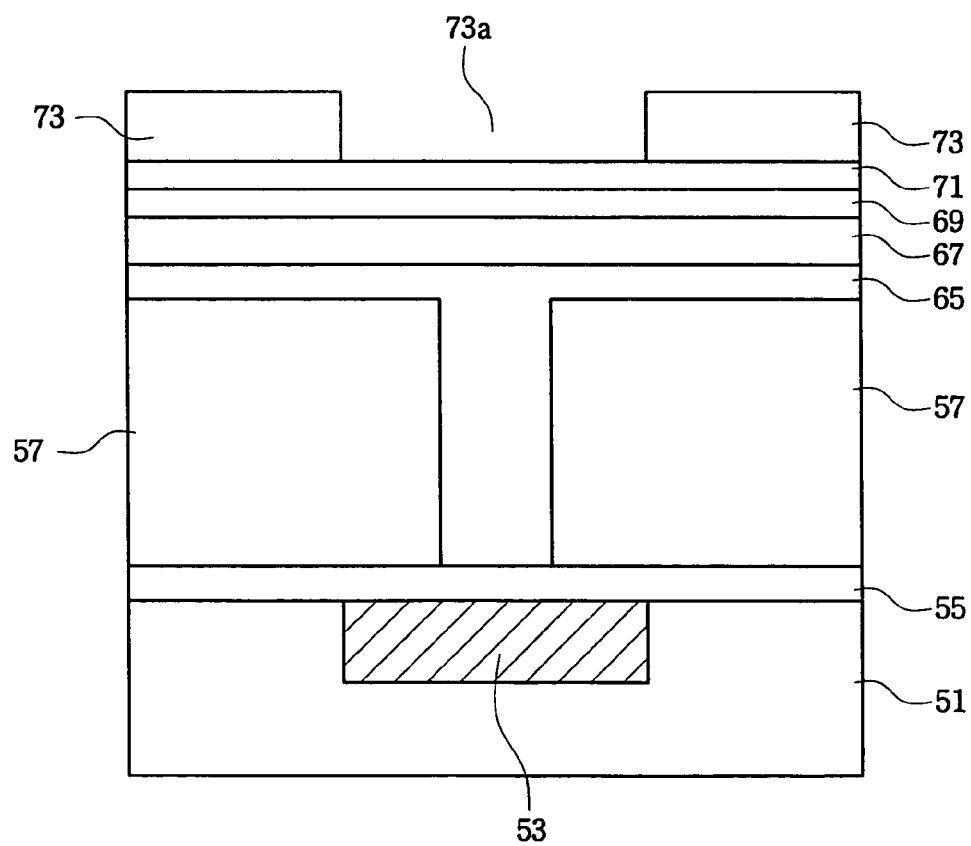

Referring to FIGS. 1 and 5, a second photoresist layer is formed on the sacrificial metal oxide layer 67. The second photoresist layer is exposed and developed to form a second photoresist pattern 73 having an opening 73a crossing over the preliminary via hole 63.

The second photoresist pattern 73 is preferably formed using an ArF laser. By doing so, a process margin such as a resolution and DOF in the photolithography process may be increased.

Further, the sacrificial metal oxide layer 67 is preferably formed of a transparent layer in a wavelength region for alignment, that is, a visible wavelength region, for a subsequent alignment process. If the sacrificial metal oxide layer 67 is transparent, there is no need of an additional process to align the second photoresist pattern 73 on the preliminary via hole 63.

Before forming the second photoresist layer, an organic BARC 71 may be formed. Specifically, the formation of the organic BARC 71 is used in the photolithography process of forming the second photoresist pattern 73 using an ArF laser. The organic BARC 71 functions to reduce reflectivity of the sacrificial metal oxide layer 67, and control a CD and a CD uniformity of the second photoresist pattern 73.

Further, before forming the organic BARC 71, a capping layer 69 may be further formed. The capping layer 69 functions as an inorganic BARC, thereby further reducing the reflectivity of the sacrificial metal oxide layer 67.

The capping layer 69 may be formed of a poly-Si, FSG, PSG, USG, PE-TEOS, SiOC, SiN, SiON, SiC, or SiCN layer. Further, the capping layer 69 is preferably formed with a thickness of 100 Å to 500 Å.

Since the capping layer 69 and the organic BARC 71 are additionally formed, the reflectivity can be reduced, and the process margin of the photolithography process of forming the second photoresist pattern 73 can be further ensured. Therefore, even though the sacrificial via protecting layer 65 is transparent, the reflectivity may be reduced.

Figure 6:
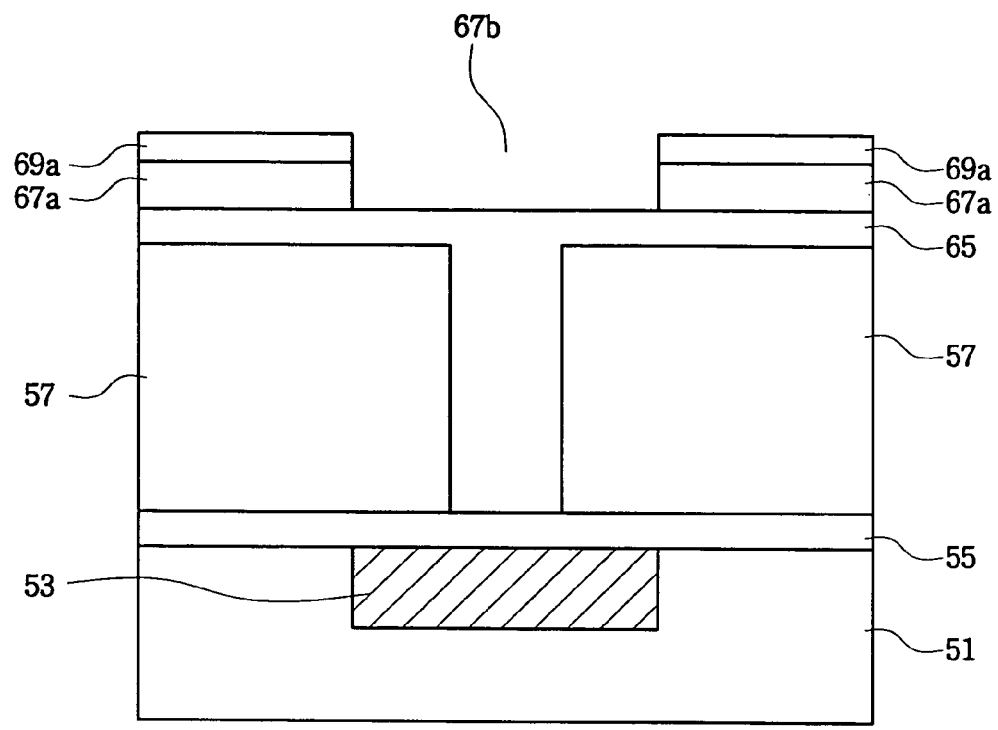

Referring to FIGS. 1 and 6, the organic BARC 71, the capping layer 69, and the sacrificial metal oxide layer 67 are sequentially etched using the second photoreist pattern 73 as an etch mask to form a capping layer pattern 69a and a sacrificial metal oxide pattern 67a (step 11 of FIG. 1). The capping layer pattern 69a and the sacrificial metal oxide pattern 67a have an opening 67b crossing over the preliminary via hole 63 and exposing the sacrificial via protecting layer 65.

The second photoresist pattern 73 is used as an etch mask while etching the organic BARC 71, the capping layer 69, and the sacrificial metal oxide layer 67. Thus, even though the second photoresist pattern 73 is formed employing a photoresist layer for ArF laser, which has a low etch resistance, a desired etch process margin may be ensured.

Further, after forming the capping layer pattern 69a and the sacrificial metal oxide pattern 67a, the second photoresist pattern 73 and the organic BARC 71 are removed using a typical method such as an ashing. Alternatively, the second photoresist pattern 73 and the organic BARC 71 may be removed after forming a trench.

Figure 7:
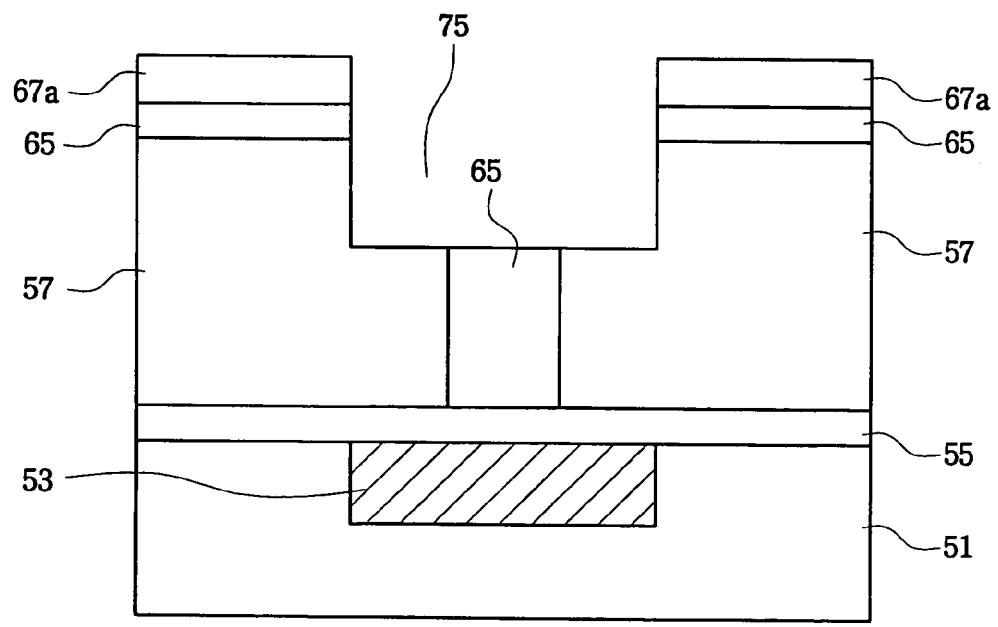

Referring to FIGS. 1 and 7, the exposed sacrificial via protecting layer 65 and the interlayer insulating layer 57 are etched using the capping layer pattern 69a and the sacrificial metal oxide pattern 67a as etch masks to form a trench 75 (step 13 of FIG. 1). The trench 75 may be formed inside the interlayer insulating layer 57 with a depth of 1,500 Å to 6,000 Å. The trench 75 may be formed by dry etching the sacrificial via protecting layer 65 and the interlayer insulating layer 57. The dry etch is preferably performed under the conditions that the etch rates of the sacrificial via protecting layer 65 and the interlayer insulating layer 57 are substantially identical, or a ratio of the etch rates between the sacrificial via protecting layer 65 and the interlayer insulating layer 57 is lower than 4:1.

Typically, the sacrificial metal oxide pattern 67a has a relatively high etch selectivity with respect to the interlayer insulating layer 57. Thus, during the formation of the trench 75, the sacrificial metal oxide pattern 67a is not completely removed and can carry out its function as an etch mask. However, as the capping layer pattern 69a is etched at an etch rate similar to that of the interlayer insulating layer 57, it may be all removed during the formation of the trench 75.

Further, the sacrificial via protecting layer 65 is dry etched at an etch rate substantially identical to that of the interlayer insulating layer 57, or is dry etched at an etch rate, which is slightly high in comparison with that of the interlayer insulating layer 57. Thus, the sacrificial via protecting layer 65 inside the preliminary via hole 63 is etched along with the interlayer insulating layer 57. Thus, during the formation of the trench 75, a part of the sacrificial via protecting layer 65 remains inside the preliminary via hole 63. As a result, the etch barrier layer 55 under the preliminary via hole 63 may be protected from the etch. Accordingly, etch damage of the lower interconnection 51 may be prevented.

Figure 8:
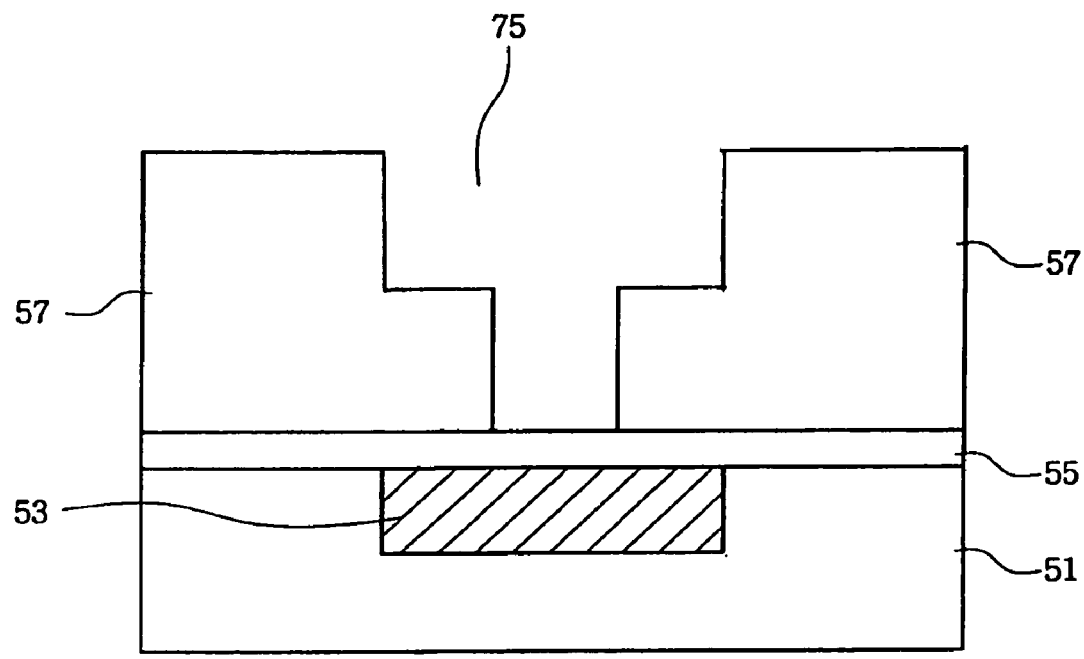

Referring to FIGS. 1 and 8, after forming the trench 75, the sacrificial metal oxide pattern 67a and the sacrificial via protecting layer 65 are removed. If the sacrificial via protecting layer 65 is formed of hydrogen-siloxane such as HSQ, the sacrificial metal oxide pattern 67a and the sacrificial via protecting layer 65 are preferably wet etched using HF solution as an etchant, and removed at the same time.

In the case in which the sacrificial via protecting layer 65 is formed of an organo-siloxane layer such as MSQ, or an SOP, the sacrificial via protecting layer 65 may not be removed using a HF solution as an etchant. In this case, the sacrificial metal oxide pattern 67a is wet etched using a HF solution as an etchant, and the sacrificial via protecting layer 65 may be removed using an organo stripper. In this case, an etchant used in the organo stripper may be varied depending on the kinds of the sacrificial via protecting layer 65.

As a result of removing the sacrificial via protecting layer 65 and the sacrificial metal oxide pattern 67a, the upper surface of the interlayer insulating layer 57 is exposed, and the etch barrier layer 55 is exposed through the preliminary via hole.

Figure 9:
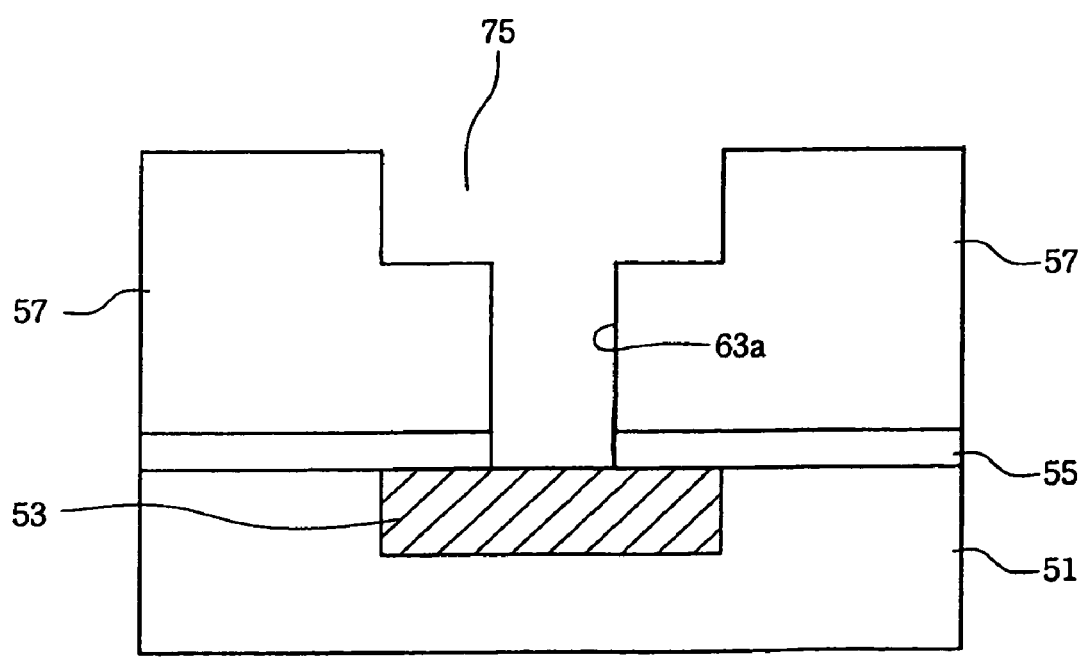

Referring to FIGS. 1 and 9, the exposed etch barrier layer 55 is removed to form a final via hole 63a exposing the lower interconnection 53 (step 15 of FIG. 1). The etch barrier layer 55 may be etched using an etchant having a high etch selectivity with respect to the interlayer insulating layer 57.

Further, the lower interconnection 53 and the etch barrier layer 55 are prevented from being etched by the sacrificial via protecting layer 65 during the formation of the trench 75. Thus, the etch barrier layer 55 may have a thickness relatively small in comparison with that of the interlayer insulating layer 57. Thus, the etch barrier layer 55 can be etched without damage to the profiles of the trench 75 and the preliminary via hole 63.

Figure 10:
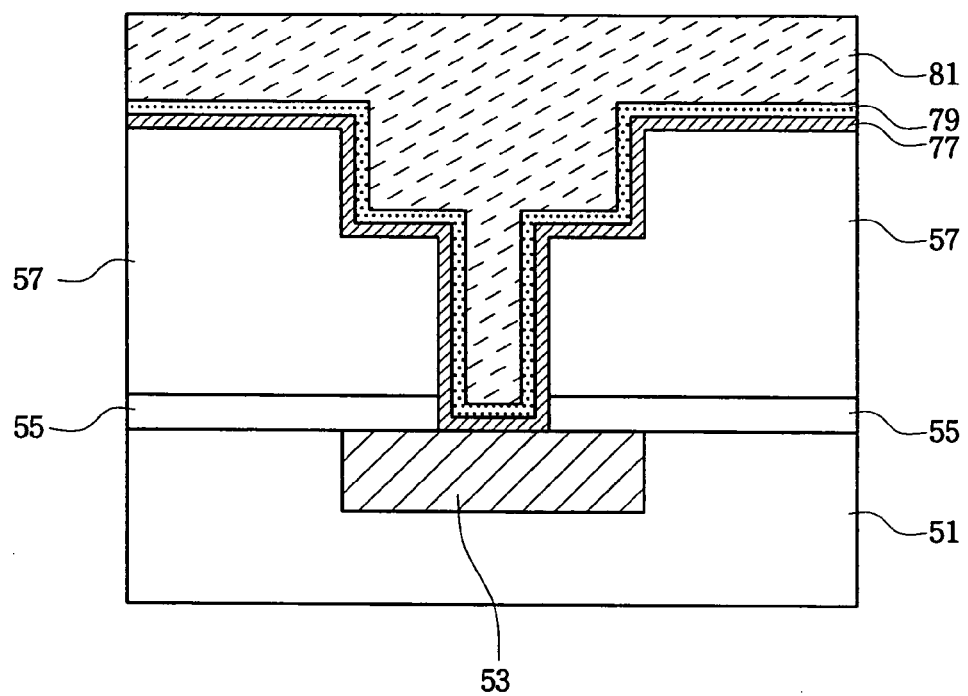

Referring to FIGS. 1 and 10, a conductive layer 81 is formed on the semiconductor substrate having the final via hole 63a and the trench 75 by a typical method (step 17 of FIG. 1). The conductive layer 81 may be a copper layer. Further, before forming the copper layer, a conformal diffusion barrier metal 77 and a seed layer 79 may be formed. The copper layer may be formed using an electrolytic plating technology or an electroless plating technology, and it may fill the empty space of the trench 75 and the final via hole 63a.

Figure 11:
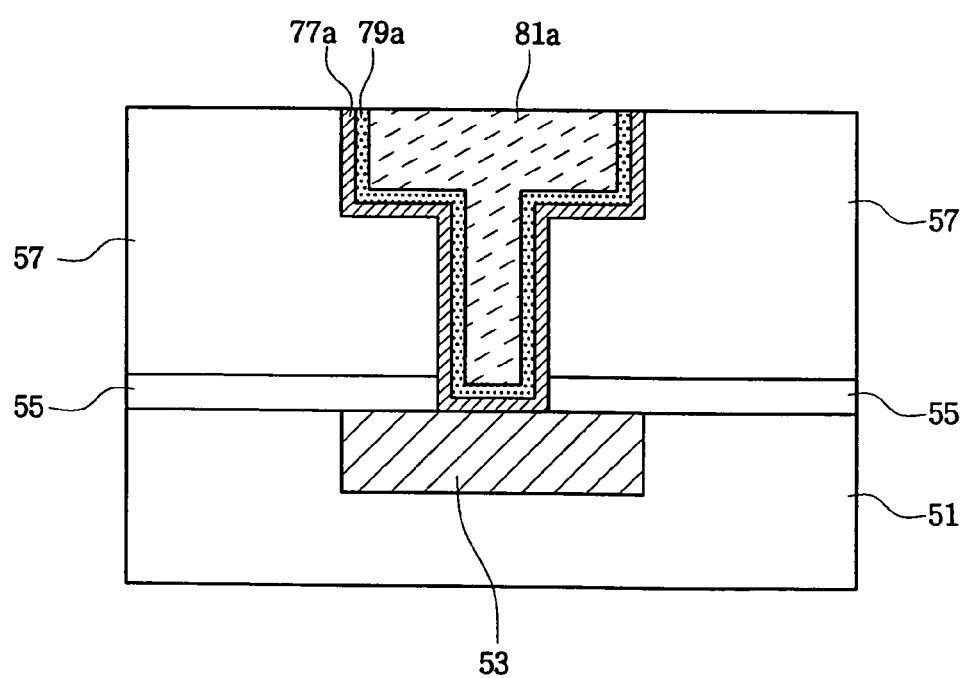

Referring to FIGS. 1 and 11, until the upper surface of the interlayer insulating layer 57 is exposed, the conductive layer 81, the seed layer 79, and the diffusion barrier metal 77 are planarized using a CMP technology (step 19 of FIG. 1). As a result, there are formed a diffusion barrier layer 77a, a seed layer 79a, and a metal interconnection 81a, which are confined inside the trench 75, and there is formed a via plug for filling the final via hole 63a. The metal interconnection 81a is electrically connected to the lower interconnection 53 through the via plug formed inside the final via hole 63a.

Accordingly, the embodiments of the present invention are effective in that process margins are ensured, i.e., the use of the sacrificial metal oxide layer 67 provides a process margin in a photolithography process of forming a trench, and the use of the sacrificial metal oxide pattern 67a as an etch mask for the formation of the trench 75 allows a process margin in an etch process. Further, by additionally forming the capping layer 69 on the sacrificial metal oxide layer 67, a reflectivity with respect to lower layers may be further reduced. As a result, a CD and a CD uniformity may be adjustable, thereby further improving a process margin of a photolithography process.

Further, since the sacrificial metal oxide layer 67 has a great light transmittance unlike metals, there is no need for an additional process of aligning the second photoresist pattern 73 on the preliminary via hole.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of forming a dual damascene metal interconnection comprising:
   a) preparing a semiconductor substrate;
   b) forming an interlayer insulating layer on the semiconductor substrate;
   c) patterning the interlayer insulating layer to form a preliminary via hole;
   d) forming a sacrificial via protecting layer, a first portion of the sacrificial via protecting layer filling the preliminary via hole and a second portion of the sacrificial via protecting layer covering an upper surface of the interlayer insulating layer at the outside of the preliminary via hole on the semiconductor substrate having the preliminary via hole;
   e) forming a sacrificial metal oxide layer on both the first and second portions of the sacrificial via protecting layer;
   f) patterning the sacrificial metal oxide layer to form a sacrificial metal oxide pattern having an opening exposing the first portion and a portion of the second portion of the sacrificial via protecting layer; and
   g) etching the sacrificial via protecting layer and the interlayer insulating layer using the sacrificial metal oxide pattern as an etch mask to form a trench located inside the interlayer insulating layer.

2. The method according to claim 1, wherein the sacrificial metal oxide layer is transparent in a visible wavelength region.

3. The method according to claim 2, wherein the sacrificial metal oxide layer is formed of at least one metal oxide layer selected from the group consisting of $Al_2O_3$, InSnO, $Ta_2O_5$, $La_2O_3$, and $HfO_2$.

4. The method according to claim 3, wherein the sacrificial metal oxide layer is formed with a thickness of about 200 Å to 1,000 Å.

5. The method according to claim 4, further comprising forming an etch barrier layer prior to formation of the interlayer insulating layer.

6. The method according to claim 5, further comprising forming an organic BARC on the sacrificial metal oxide layer after forming the sacrificial metal oxide layer.

7. The method according to claim 6, further comprising removing the organic BARC prior to formation the trench.

8. The method according to claim 7, wherein the organic BARC is removed using an ashing process.

9. The method according to claim 6, further comprising forming a capping layer on the sacrificial metal oxide layer prior to formation of the organic BARC.

10. The method according to claim 9, wherein the capping layer is formed of a material layer selected from the group consisting of poly-Si, FSG, PSG, USG, PE-TEOS, SiOC, SiN, SiON, SiC, and SiCN layer.

11. A method of forming a dual damascene metal interconnection comprising:
   a) preparing a semiconductor substrate;
   b) forming an interlayer insulating layer on the semiconductor substrate;
   c) patterning the interlayer insulating layer to form a preliminary via hole;
   d) forming a sacrificial via protecting layer, a first portion of the sacrificial via protecting layer filling the preliminary via hole and a second portion of the sacrificial via protecting layer covering an upper surface of the interlayer insulating layer at the outside of the preliminary via hole on the semiconductor substrate having the preliminary via hole;
   e) forming a sacrificial metal oxide layer on both the first and second portions of the sacrificial via protecting layer;
   f) forming a photoresist layer on the sacrificial metal oxide layer;
   g) exposing and developing the photoresist layer using an ArF laser to form a photoresist pattern having an opening crossing over the preliminary via hole;
   h) etching the sacrificial metal oxide layer using the photoresist pattern as an etch mask to form a sacrificial metal oxide pattern having an opening exposing the first portion and a portion of the second portion of the sacrificial via protecting layer; and
   i) etching the sacrificial via protecting layer and the interlayer insulating layer using the sacrificial metal oxide pattern as an etch mask to form a trench located inside the interlayer insulating layer.

12. The method according to claim 11, wherein the sacrificial metal oxide layer is transparent in a visible wavelength region.

13. The method according to claim 12, wherein the sacrificial metal oxide layer is formed of at least one metal oxide layer selected from the group consisting of $Al_2O_3$, InSnO, $Ta_2O_5$, $La_2O_3$, and $HfO_2$.

14. The method according to claim 13, wherein the sacrificial metal oxide layer is formed with a thickness of about 200 Å to 1,000 Å.

15. The method according to claim 14, further comprising:
   forming an etch barrier layer prior to formation of the interlayer insulating layer.

16. The method according to claim 15, further comprising:
   forming an organic BARC on the sacrificial metal oxide layer after forming the sacrificial metal oxide layer.

17. The method according to claim 16, further comprising:
    removing the organic BARC prior to formation of the trench.

18. The method according to claim 17, wherein the organic BARC is removed using an ashing process.

19. The method according to claim 16, further comprising:
    forming a capping layer on the sacrificial metal oxide layer prior to formation of the organic BARC.

20. The method according to claim 19, wherein the capping layer is formed of one material layer selected from the group consisting of poly-Si, FSG, PSG, USG, PE-TEOS, SiOC, SiN, SION, SiC, and SiCN layer.

* * * * *

UNITED STATES PATENT AND TRADEMARK OFFICE
CERTIFICATE OF CORRECTION

PATENT NO. : 7,064,059 B2  Page 1 of 1
APPLICATION NO. : 10/939930
DATED : June 20, 2006
INVENTOR(S) : Jae-Hak Kim et al.

It is certified that error appears in the above-identified patent and that said Letters Patent is hereby corrected as shown below:

In Claim 20, Column 12, Line 6, delete "SION" and insert --SiON--.

Signed and Sealed this

Twenty-first Day of November, 2006

JON W. DUDAS
*Director of the United States Patent and Trademark Office*